United States Patent
You et al.

(10) Patent No.: US 10,980,119 B2
(45) Date of Patent: Apr. 13, 2021

(54) DISPLAY DEVICE AND METHOD OF MANUFACTURING THE SAME

(71) Applicant: Samsung Display Co., Ltd., Yongin-si (KR)

(72) Inventors: Junwoo You, Seongnam-si (KR); Atsushi Nemoto, Suwon-si (KR); Byoungdae Ye, Yongin-si (KR); Taeho Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 14 days.

(21) Appl. No.: 16/542,206

(22) Filed: Aug. 15, 2019

(65) Prior Publication Data
US 2020/0163216 A1 May 21, 2020

(30) Foreign Application Priority Data
Nov. 16, 2018 (KR) .................. 10-2018-0141306

(51) Int. Cl.
| | |
|---|---|
| *H05K 1/11* | (2006.01) |
| *H05K 1/18* | (2006.01) |
| *H05K 3/42* | (2006.01) |
| *G02F 1/13* | (2006.01) |
| *G02F 1/1333* | (2006.01) |

(Continued)

(52) U.S. Cl.
CPC ............. *H05K 1/147* (2013.01); *H05K 1/113* (2013.01); *H05K 1/189* (2013.01); *H05K 3/363* (2013.01); *H05K 3/4038* (2013.01); *H05K 2201/098* (2013.01); *H05K 2201/10128* (2013.01);

(Continued)

(58) Field of Classification Search
CPC . H05K 1/11; H05K 1/18; H05K 1/112; H05K 3/42; H05K 3/422; H05K 3/423; G02F 1/13; G02F 1/1333; G02F 1/1335; G02F 1/1343; G02F 1/1339;
(Continued)

(56) References Cited

U.S. PATENT DOCUMENTS 6,961,111 B1 * 11/2005 Kuramasu ........... G02F 1/13454
349/152
7,205,230 B2    4/2007 Mashino
(Continued)

FOREIGN PATENT DOCUMENTS

| KR | 10-2005-0022324 A | 3/2005 |
| KR | 10-1021222 B1 | 3/2011 |

(Continued)

*Primary Examiner* — Xiaoliang Chen
(74) *Attorney, Agent, or Firm* — Lewis Roca Rothgerber Christie LLP

(57) ABSTRACT

A display device and a method of manufacturing the display device are capable of substantially minimizing damage to a display panel. The display device includes: a first substrate including a display area and a pad area; a polarization film disposed at an upper surface of the first substrate to overlap the display area; a flexible printed circuit board disposed at a lower surface of the first substrate; a via hole defined through the first substrate at the pad area; and a connection metal located at the via hole. The connection metal includes a connection portion disposed in the via hole and a first protruding portion that protrudes with respect to the first substrate, and the polarization film is spaced apart from the via hole in a plan view.

7 Claims, 8 Drawing Sheets

(51) Int. Cl.
*G02F 1/1335* (2006.01)
*G02F 1/1343* (2006.01)
*G02F 1/1339* (2006.01)
*G02F 1/1362* (2006.01)
*H01L 21/00* (2006.01)
*H01L 21/50* (2006.01)
*H01L 21/768* (2006.01)
*H01L 27/12* (2006.01)
*H01L 27/32* (2006.01)
*H01L 29/04* (2006.01)
*H05K 1/14* (2006.01)
*H05K 3/36* (2006.01)
*H05K 3/40* (2006.01)

(52) U.S. Cl.
CPC .............. *H05K 2201/10136* (2013.01); *H05K 2203/085* (2013.01); *H05K 2203/107* (2013.01)

(58) Field of Classification Search
CPC ....... G02F 1/1362; H01L 21/00; H01L 21/50; H01L 21/768; H01L 27/12; H01L 27/32; H01L 29/04
USPC .... 361/749, 751, 796; 345/82, 87, 173, 204, 345/212; 349/111, 138, 139, 147, 349/152–154; 257/22, 59, 434, 680
See application file for complete search history.

(56) References Cited

U.S. PATENT DOCUMENTS

| | | | | |
|---|---|---|---|---|
| 8,227,806 | B2 * | 7/2012 | Yamazaki | G02F 1/13454 257/59 |
| 8,486,827 | B2 | 7/2013 | Yoo et al. | |
| 2002/0015275 | A1 * | 2/2002 | Sun | H02N 13/00 361/234 |
| 2007/0205413 | A1 * | 9/2007 | Yamazaki | H01L 29/78624 257/59 |
| 2008/0001241 | A1 * | 1/2008 | Tuckerman | H01L 31/0203 257/434 |
| 2008/0083927 | A1 * | 4/2008 | Nishiura | G02F 1/136227 257/72 |
| 2008/0218678 | A1 * | 9/2008 | Nakayama | G02F 1/1345 349/147 |
| 2010/0144137 | A1 * | 6/2010 | Lee | H01L 24/81 438/618 |
| 2011/0255251 | A1 * | 10/2011 | Kitagawa | G02B 6/0083 361/751 |
| 2013/0293482 | A1 | 11/2013 | Burns et al. | |
| 2014/0049522 | A1 * | 2/2014 | Mathew | H01L 51/5281 345/204 |
| 2014/0111496 | A1 * | 4/2014 | Gomez | G09G 3/3696 345/212 |
| 2014/0175444 | A1 * | 6/2014 | Yamazaki | G02F 1/13454 257/59 |
| 2015/0103302 | A1 * | 4/2015 | Nagasawa | G02F 1/134336 349/153 |
| 2016/0103376 | A1 * | 4/2016 | Nagasawa | H01L 27/124 257/72 |
| 2016/0147121 | A1 * | 5/2016 | Nakajima | G02F 1/13452 349/111 |
| 2016/0179229 | A1 * | 6/2016 | Ahn | G06F 3/04164 345/173 |
| 2016/0306488 | A1 * | 10/2016 | Kim | G06F 1/1626 |
| 2017/0075464 | A1 * | 3/2017 | Ahn | H01L 27/323 |
| 2017/0352834 | A1 * | 12/2017 | Kim | H01L 27/3276 |
| 2017/0371465 | A1 * | 12/2017 | Ahn | G09G 3/3208 |
| 2018/0145125 | A1 * | 5/2018 | Lee | H01L 27/3262 |
| 2018/0180911 | A1 * | 6/2018 | Odaka | H01L 51/0097 |
| 2018/0277738 | A1 * | 9/2018 | Ohashi | H01L 41/047 |
| 2019/0189646 | A1 * | 6/2019 | Watanabe | H05K 3/423 |

FOREIGN PATENT DOCUMENTS

KR  10-1071180 B1  10/2011
KR  10-2015-0011371 A  1/2015

* cited by examiner

DISPLAY DEVICE AND METHOD OF MANUFACTURING THE SAME

CROSS-REFERENCE TO RELATED APPLICATION

This application claims priority to and the benefit of Korean Patent Application No. 10-2018-0141306, filed on Nov. 16, 2018 in the Korean Intellectual Property Office (KIPO), the disclosure of which is incorporated by reference herein in its entirety.

BACKGROUND

1. Field

Embodiments of the present invention relate to a display device having a via hole and to a method of manufacturing the display device.

2. Discussion of Related Art

As information society develops, there is a growing demand for display devices that display images. Accordingly, in recent times, various kinds of display devices, such as liquid crystal display (LCD) devices, plasma display panel (PDP) devices, and/or organic light emitting diode (OLED) display devices, are used.

A display device includes a display panel and an integrated circuit for driving the display panel. Such an integrated circuit, for example, is attached to a back surface of the display panel, and the integrated circuit may be connected to the display panel through a via hole that is defined through a substrate of the display panel and a metal filled in the via hole. In such a case, a laser process may be performed to form the metal to be filled in the via hole that is defined through the substrate of the display panel, and the display panel may be damaged due to the heat that may be generated in the laser process.

It is to be understood that this background of the technology section is intended to provide useful background for understanding the technology disclosed herein, and, as such, the technology background section may include ideas, concepts, or recognitions that were not part of what was known or appreciated by those skilled in the pertinent art prior to a corresponding effective filing date of the subject matter disclosed herein.

SUMMARY

Aspects of embodiments of the present invention may be directed toward a display device capable of substantially reducing or minimizing damage to a display panel and a method of manufacturing the display device.

According to an embodiment, a display device includes: a first substrate including a display area and a pad area; a polarization film disposed at an upper surface of the first substrate to overlap the display area; a flexible printed circuit board disposed at a lower surface of the first substrate; a via hole defined through the first substrate at the pad area; and a connection metal located at the via hole. The connection metal includes a connection portion disposed in the via hole and a first protruding portion that protrudes with respect to the first substrate, and the polarization film is spaced apart from the via hole in a plan view.

The first protruding portion of the connection metal may be in the shape of one selected from a hemisphere, a polygonal pyramid, a circular cone, a polygonal column, and a cylinder.

The display device may further include: a first link line disposed at the pad area; and a pad terminal connected to the first link line and having a width greater than a width of the first link line. A diameter or breadth of the connection portion of the connection metal may be less than the width of the pad terminal.

The first substrate may include at least one selected from borosilicate glass, soda lime glass, quartz, and Pyrex.

The connection metal may include at least one selected from low melting point metals (e.g., In, Sn, Zn, and/or Pb) or low melting point metal alloys (e.g., PbSn and/or InSn).

The display device may further include: a second link line disposed facing the first link line with the first substrate therebetween. The flexible printed circuit board may include: a base layer, and a first lead line disposed on the base layer. The second link line may directly contact the connection metal.

According to another embodiment, a display device includes: a first substrate including a display area and a pad area; a polarization film disposed at an upper surface of the first substrate to overlap the display area; a flexible printed circuit board disposed at a lower surface of the first substrate; a via hole defined through the first substrate at the pad area; and a connection metal located at the via hole. The connection metal includes a connection portion disposed in the via hole and a first protruding portion that protrudes with respect to the upper surface of the first substrate. A diameter or breadth of the connection portion of the connection metal is less than a diameter or breadth of the protruding portion of the connection metal.

The first protruding portion of the connection metal may be in the shape of one selected from a hemisphere, a polygonal pyramid, a circular cone, a polygonal column, and a cylinder.

The display device may further include: a first link line disposed at the pad area; and a pad terminal connected to the first link line and having a width greater than a width of the first link line. A diameter or breadth of the connection portion of the connection metal may be less than the width of the pad terminal.

The first substrate may include at least one selected from borosilicate glass, soda lime glass, quartz, and Pyrex.

The connection metal may include at least one selected from low melting point metals (e.g., In, Sn, Zn, and/or Pb) or low melting point metal alloys (e.g., PbSn and/or InSn).

The display device may further include: a second link line disposed facing the first link line with the first substrate therebetween. The flexible printed circuit board may include: a base layer, and a first lead line disposed on the base layer. The second link line may directly contact the connection metal.

According to another embodiment, a method of manufacturing a display device includes: forming a display panel by arranging a pixel at a display area of a first substrate, arranging a pad terminal and defining a via hole at a pad area, and arranging a polarization film to overlap the display area of the first substrate; sequentially stacking a pressurization unit, a connection metal material that is solid, a nozzle glass, the display panel that includes the first substrate and the polarization film, and a cover glass; emitting a laser beam to the connection metal material that is solid from above the cover glass and liquefying a part of the connection metal material that is solid; generating a vacuum at a space where the display panel is placed, and the pressurization unit applying a pressure to the part of the connection metal material that is liquefied; forming a connection portion of a connection metal by filling the via hole with the part of the connection metal material that is liquefied, and forming a first protruding portion of the connection metal by allowing the part of the connection metal material that is liquefied to be filled up to a lower surface of the cover glass; releasing the vacuum that is generated at the space where the display panel is placed, and releasing the pressure that is applied to the part of the connection metal material that is liquefied; and separating the pressurization unit, the connection metal material that is solid, the nozzle glass, the display panel that includes the first substrate and the polarization film, and the cover glass that are sequentially stacked from each other.

The nozzle glass may include an orifice nozzle.

The lower surface of the cover glass may have a concave portion in the shape of one selected from a hemisphere, a polygonal pyramid, a circular cone, a polygonal column, and a cylinder.

A diameter or breadth of the connection portion of the connection metal is less than a diameter or breadth of the first protruding portion of the connection metal.

The forming of the display panel may include: forming a first link line that is connected to the pixel, and forming the pad terminal that is connected to the first link line to have a width greater than a width of the first link line. A diameter or breadth of the connection portion of the connection metal may be less than the width of the pad terminal.

The laser beam may be an ultrasound pulse laser beam.

The first substrate may include at least one selected from borosilicate glass, soda lime glass, quartz, and Pyrex.

The foregoing is illustrative only and should not be intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

A more complete appreciation of the present invention will become more apparent by describing in more detail embodiments thereof with reference to the accompanying drawings, wherein.

DETAILED DESCRIPTION

Figure 1:
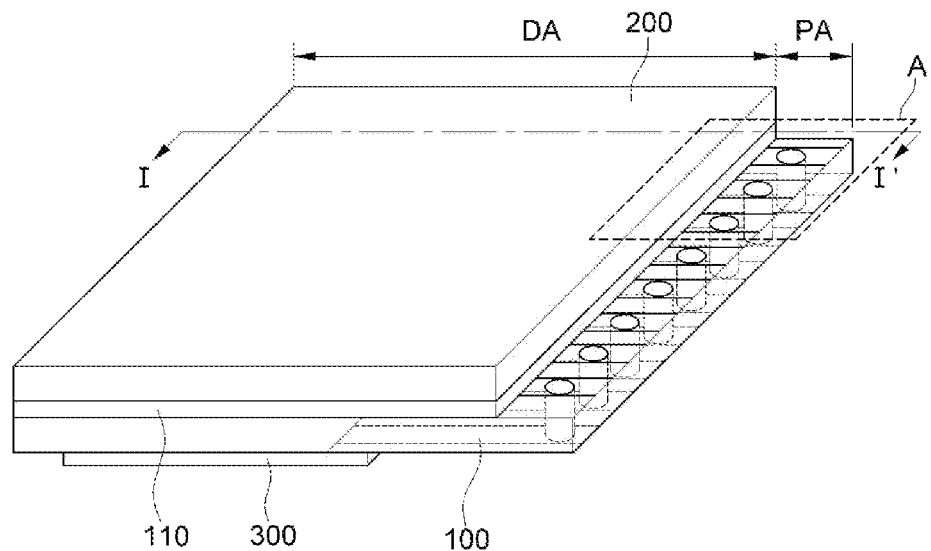
FIG. 1 is a perspective view illustrating a display device according to an embodiment.

Embodiments will now be described more fully hereinafter with reference to the accompanying drawings.

Although the invention may be modified in various suitable manners and have several embodiments, embodiments are illustrated in the accompanying drawings and will be mainly described in the specification. However, the scope of embodiments should not be limited to the embodiments and should be construed as including all the changes, equivalents, and substitutions included in the spirit and scope of the present invention.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or one or more intervening layers, areas, or plates may be present therebetween. Conversely, when a layer, area, or plate is referred to as being "directly on" another layer, area, or plate, intervening layers, areas, or plates should be absent therebetween. Further, when a layer, area, or plate is referred to as being "below" another layer, area, or plate, it may be directly below the other layer, area, or plate, or one or more intervening layers, areas, or plates may be present therebetween. Conversely, when a layer, area, or plate is referred to as being "directly below" another layer, area, or plate, intervening layers, areas, or plates should be absent therebetween.

The spatially relative terms "below," "beneath," "lower," "above," "upper," and the like may be used herein for ease of description to describe the relations between one element or component and another element or component as illustrated in the drawings. It will be understood that the spatially relative terms are intended to encompass different orientations of the device in use or operation, in addition to the orientation illustrated in the drawings. For example, in a case where a device illustrated in the drawings is turned over, the device positioned "below" or "beneath" another device may be placed "above" another device. Accordingly, the illustrative term "below" may include both the lower and upper positions. The device may also be oriented in the other direction, and, thus, the spatially relative terms may be interpreted differently depending on the orientations.

Throughout the specification, when an element is referred to as being "connected" to another element, the element may be "directly connected" to the other element, or may be "electrically connected" to the other element with one or more intervening elements therebetween. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

Each of the terms "about" and "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, or 5% of the stated value.

Also, as used herein, the terms "substantially," "about," and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Unless otherwise defined, all terms used herein (including technical and scientific terms) have the same meanings as are commonly understood by those skilled in the art to which this invention pertains. It will be further understood that terms, such as those defined in commonly used dictionaries, should be interpreted as having meanings that are consistent with their meanings in the context of the relevant art and will not be interpreted in an ideal or excessively formal sense unless clearly defined in the present specification.

Some of the parts which are not associated with the description may not be provided in order to, for example, describe embodiments of the present invention, and like reference numerals refer to like elements throughout the specification.

Figure 2:
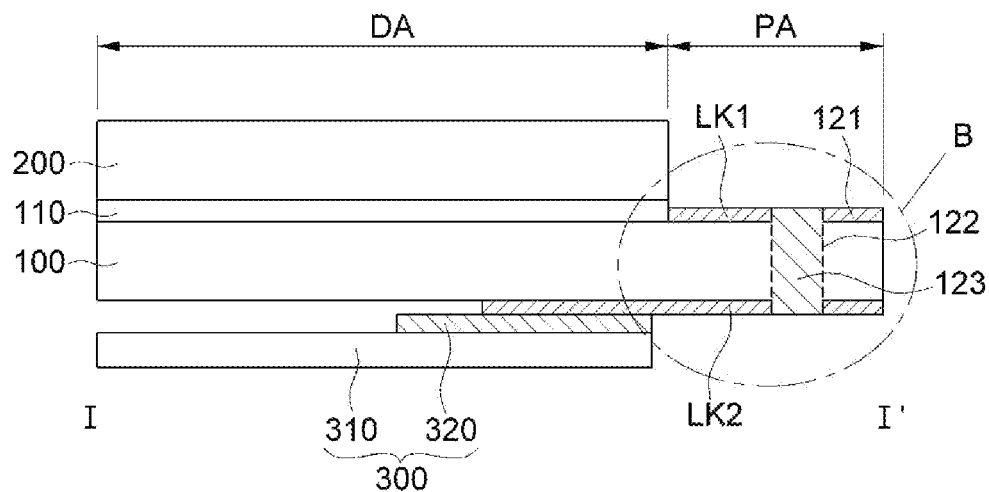
FIG. 2 is a cross-sectional view taken along line I-I' of FIG. 1.

FIG. 1 is a perspective view illustrating a display device according to an embodiment, and FIG. 2 is a cross-sectional view taken along line I-I' of FIG. 1.

A display device according to an embodiment, as illustrated in FIGS. 1 and 2, includes a first substrate 100, a display layer 110, a polarization film 200, and a flexible printed circuit board (FPCB) 300.

The first substrate 100 has a display area DA and a pad area PA. The display layer 110 is disposed on the display area DA of the first substrate 100. In one or more embodiments, the display layer 110 disposed at the display area DA includes gate lines, data lines, and a plurality of pixels connected to the gate lines and the data lines. The pixel may include a switching element, a pixel electrode, and a common electrode. The switching element may include a gate electrode connected to the gate line, a source electrode connected to the data line, and a drain electrode connected to the pixel electrode. The switching element is also referred to as a thin film transistor.

The common electrode may be disposed at a second substrate, and a liquid crystal layer or an organic light emitting layer may be disposed between the common electrode and the pixel electrode. In an embodiment, the common electrode may be disposed at the first substrate 100.

In addition, the pixel may further include a color filter and a light blocking layer, and the color filter and the light blocking layer may be disposed at the first substrate or the second substrate.

In one or more embodiments, each of the gate lines is connected to a gate driver. The gate driver generates gate signals and sequentially applies the gate signals to the gate lines.

The plurality of data lines that are located at the display area DA may intersect or cross the gate lines, and each of the data lines may be connected to one of pad terminals 121.

A first link line LK1 may extend from the plurality of data lines located at the display area DA to the pad terminal 121 and electrically connect the data line and the pad terminal 121. For example, the first link line LK1 may be disposed between the data line at an upper surface of the first substrate 100 and the pad terminal 121 at the pad area PA, and may be integrally formed with the data line and the pad terminal 121 as a unitary structure.

Each of the data lines may be connected to the pad terminal 121 through a corresponding first link line LK1. That is, a corresponding first link line LK1 extends from each of the data lines, and the first link line LK1 is disposed at the pad area PA. The first link line LK1 may extend parallel with a corresponding one or each of the data lines, or, alternatively, the first link line LK1 may extend to have an angle (e.g., greater than 0 degree) with respect to a corresponding one or each of the data lines.

As illustrated in FIG. 2, the pad terminal 121 is defined as an end portion of the first link line LK1 that is located at the pad area PA. The pad terminal 121 may have a width greater than a width of the first link line LK1, which will be described in detail below with reference to FIG. 3.

According to an embodiment, a via hole 122 may be located at the pad terminal 121. A connection metal 123 may fill the via hole 122, and connect the pixel located at the display area with the FPCB 300.

As illustrated in FIG. 2, a second link line LK2 is located at a lower surface of the first substrate 100 at the pad area PA. For example, the second link line LK2 may be electrically connected to a first lead line 320 of the FPCB 300, to be described below, which is disposed at the lower surface of the first substrate 100. In such an embodiment, the second link line LK2 may be disposed facing the first link line LK1 with the first substrate 100 therebetween.

The second link line LK2 is electrically connected to the pad terminal 121 and the first link line LK1. For example, the second link line LK2 directly contacts the connection metal 123 to be electrically connected thereto, and is electrically connected to the pad terminal 121 and the first link line LK1 that are connected to the connection metal 123.

In one or more embodiments, a second substrate may be disposed on the first substrate 100. In addition, a liquid crystal layer or an organic light emitting layer may be further disposed on the first substrate 100. However, embodiments are not limited thereto, and, in another embodiment, a liquid crystal layer or an organic light emitting layer may be further disposed between the first substrate 100 and the second substrate.

According to an embodiment, the first substrate 100 includes at least one selected from borosilicate glass, soda lime glass, quartz, and Pyrex. Accordingly, influence of a laser process onto the first substrate 100 may be substantially minimized. For example, the first substrate 100 that includes glass has high heat resistance, and thus damage and delamination due to heat that may be generated in the laser process may be substantially reduced or minimized.

According to an embodiment, the polarization film 200 may be disposed on the display area DA of the first substrate 100. For example, the polarization film 200 may be disposed at the display area DA of the first substrate 100, and may not be disposed at the pad area PA. In particular, the polarization film 200 may be spaced apart from the via hole 122 located at the pad area PA in a plan view. Accordingly, influence of the laser process, performed to fill the via hole 122, onto the polarization film 200 may be substantially minimized. For example, it is possible to substantially prevent the polarization film 200 from being deformed by the heat that may be generated by the laser process, which will be described in more detail below with reference to FIGS. 3 to 6.

The FPCB 300 is disposed at the lower surface of the first substrate 100. The FPCB 300 is connected to the second link line LK2, and is connected to the pad terminal 121 and the first link line LK1 through the connection metal 123 that is connected to the second link line LK2. Accordingly, the display device according to an embodiment may have a thin bezel.

The FPCB 300 may include a base layer 310, a first lead line 320, a second lead line, and a coating layer. The base layer 310 may include polyimide. The first lead line 320 may be electrically connected to the aforementioned connection metal 123. For example, the first lead line 320 may be electrically connected to the second link line LK2 that directly contacts the connection metal 123. The second lead line may be electrically connected to the first lead line 320. For example, the second lead line may be integrally formed with the first lead line 320 as a unitary structure. The coating layer may include a solder resist.

The FPCB 300 may be a tape carrier or a flexible printed circuit (FPC).

Although not illustrated, the FPCB 300 may further include a driving integrated circuit. That is, the driving integrated circuit may be mounted on the FPCB 300 by surface mounting technology. The driving integrated circuit may be electrically connected to the first lead line 320 and the second lead line. The driving integrated circuit provides an image data signal to the data lines.

Hereinafter, the polarization film 200, the pad terminal 121, the via hole 122, and the connection metal 123 according to an embodiment will be described in detail with reference to FIGS. 3 to 6.

Figure 3:
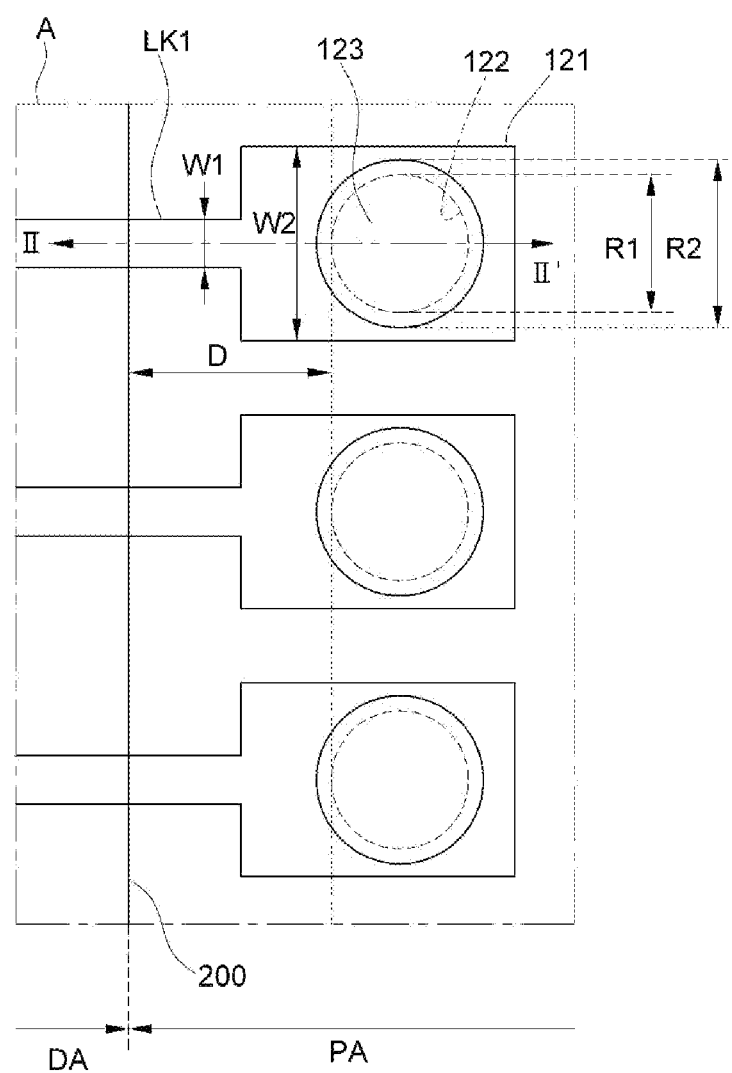
FIG. 3 is a plan view enlarging area A in FIG. 1.
Figure 4:
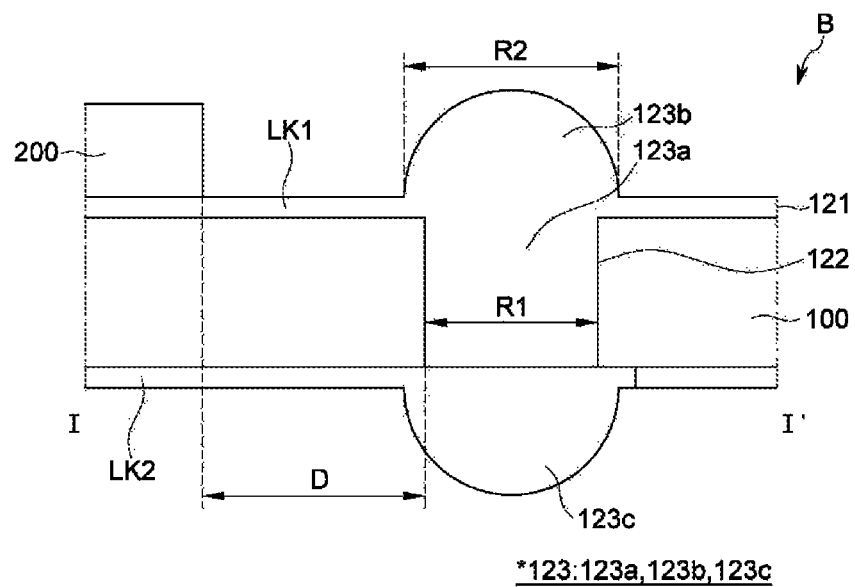
FIG. 4 is a cross-sectional view taken along line II-II' in FIG. 3.
Figure 5:
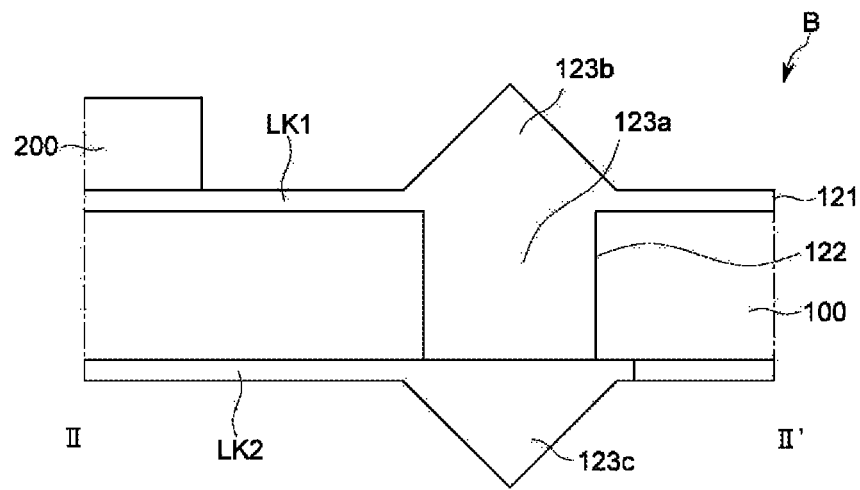
FIGS. 5 and 6 are cross-sectional views taken along line II-II' in FIG. 3.
Figure 6:
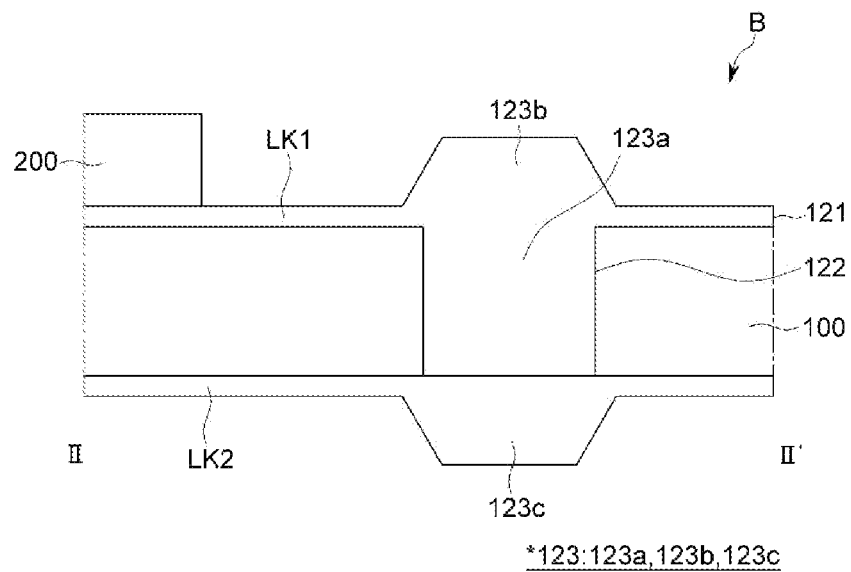

FIG. 3 is a plan view enlarging area A in FIG. 1, FIG. 4 is a cross-sectional view taken along line II-II' in FIG. 3, and FIGS. 5 and 6 are cross-sectional views taken along line II-II' in FIG. 3.

Referring to FIG. 3, the polarization film 200 is disposed at the display area DA, and the first link line LK1, the pad terminal 121, the via hole 122, and the connection metal 123 are disposed at the pad area PA.

In one or more embodiments, the polarization film 200 may include a polarizing layer and a protective layer. The polarizing layer may include a polyvinyl alcohol (PVA) film. For example, the polarizing layer may be obtained by adsorbing halogen salt crystals such as iodine to the PVA film, and then stretching the PVA film in a specific direction to align the iodine crystals parallelly in the stretching direction. The protective layer may include at least one selected from an acetate resin (e.g., triacetyl cellulose (TAC)), a polyester resin, a polyimide resin, a polyolefin resin, an acrylic resin, and a polynorbornene resin. As such, because the polarization film 200 includes a polymer material and is not high in heat resistance, in order to prevent or protect the polarization film 200 from being deformed due to heat that may be generated in the laser process, the polarization film 200 according to an embodiment is spaced apart from the via hole 122 by a distance D of about 0.5 mm or more and about 1.0 mm or less in a plan view (e.g., 0.5 mm to 1.0 mm). In such an embodiment, the distance between the polarization film 200 and the via hole 122 may be defined as a shortest distance between one side of the polarization film 200 closest to the pad area PA and an edge of the via hole 122 closest to the display area DA. That is, the polarization film 200 and the via hole 122 are located so that the one side of the polarization film 200 closest to the pad area PA is spaced apart from the edge of the via hole 122 closest to the display area DA by a distance D of about 0.5 mm or more and about 1.0 mm or less.

In a case where the polarization film 200 is spaced apart from the via hole 122 by a distance D of less than 0.5 mm, the polarization film 200 may be deformed by the heat generated in the laser process for forming the connection metal 123 at the via hole 122, and deterioration in display quality may occur. On the other hand, in a case where the polarization film 200 is spaced apart from the via hole 122 by a distance D of more than 1.0 mm, a bezel of the display device may be increased.

The polarization film 200 may allow only specific polarized light between light that arrives from the outside to pass through the polarization film 200, and may absorb or block the remaining light. In addition, a separate polarization film 200 may be disposed at the lower surface of the first substrate 100, and, in such an embodiment, the polarization film 200 disposed at the lower surface of the first substrate 100 may allow only specific polarized light among the light emitted from a backlight unit to pass through the polarization film 200, and may absorb or block the remaining light.

The first link line LK1 extends from each of the gate lines or the data lines disposed at the display area DA. In such an embodiment, the pad terminal 121 is an end portion of the first link line LK1 disposed at the pad area PA. In such an embodiment, the pad terminal 121 may have a width W2 that is greater than a width W1 of the first link line LK1 (W1<W2) so as to aid connection or be easily connected to the FPCB 300 and the driving integrated circuit 400.

According to an embodiment, the via hole 122 is located at the pad terminal 121. The via hole 122 is defined through the first substrate 100 and the pad terminal 121.

As illustrated in FIG. 3, the via hole 122 has a diameter or breadth R1 that is greater than the width W1 of the first link line LK1 (W1<R1). Accordingly, the connection metal 123 may be easily connected to the first lead line 320 of the FPCB 300. In addition, the via hole 122 has the diameter or breadth R1 that is less than the width W2 of the pad terminal 121 (W2>R1). Accordingly, electrical connection between the pad terminals 121 may be substantially prevented.

According to an embodiment, the connection metal 123 disposed at the via hole 122 may connect the upper surface and the lower surface of the first substrate 100 to provide a conductive path. For example, the connection metal 123 is disposed at the via hole 122 to connect the pixels disposed at the upper surface of the first substrate 100 with the FPCB 300 disposed at the lower surface of the first substrate 100. The gate line or the data line is connected to the pixel disposed at the display area DA, and the connection metal 123 is electrically connected to the pad terminal 121 extending from the gate line or the data line, and is electrically connected to the first lead line 320 of the FPCB 300. For example, the connection metal 123 directly contacts and is electrically connected to the pad terminal 121 and the first link line LK1, extending from the data line, at the upper surface of the first substrate 100 and at the via hole 122. In addition, the connection metal 123 directly contacts and is electrically connected to the second link line LK2 at the lower surface of the first substrate 100 and at the via hole 122.

The connection metal 123 includes a connection portion 123a that is located in the via hole 122, and a first protruding portion 123b that protrudes with respect to the upper surface of the first substrate 100.

Referring to FIGS. 4 to 6, the connection portion 123a of the connection metal 123 fills a space defined by the via hole 122. Accordingly, the connection portion 123a may have a diameter or breadth R1 that is substantially equal to the diameter or breadth of the via hole 122 in a plan view.

The first protruding portion 123b protrudes with respect to the upper surface of the first substrate 100 and the pad terminal 121. As illustrated in FIG. 4, the first protruding portion 123b may have a diameter or breadth R2 greater than or substantially equal to the diameter or breadth R1 of the connection portion 123a in a plan view (R2≥1). Accordingly, the first protruding portion 123b and the pad terminal 121 may be connected to each other, and a contact area between the first protruding portion 123b and the pad terminal 121 may increase to be easily connected to the pad terminal 121. However, embodiments are not limited thereto, and, according to another embodiment, the first protruding portion 123b may have a diameter or breadth R3 less than or substantially equal to the diameter or breadth R1 of the connection portion 123a in a plan view (R3≤1). Accordingly, the first protruding portion 123b and the pad terminal 121 may not be connected to each other.

As illustrated in FIG. 4, the first protruding portion 123b may protrude with respect to the first substrate 100 and the pad terminal 121, and may have a hemispherical shape. Alternatively, as illustrated in FIG. 5, the first protruding portion 123b may be in the shape of one selected from a polygonal pyramid (e.g., a triangular pyramid or a quadrangular pyramid) and a circular cone. Alternatively, as illustrated in FIG. 6, the first protruding portion 123b may be in the shape of a polygonal column or a circular column.

According to an embodiment, as illustrated in FIGS. 5 and 6, the connection metal 123 may further include a second protruding portion 123c. The second protruding portion 123c protrudes with respect to the first substrate 100 and the pad terminal 121. For example, the second protruding portion 123c protrudes with respect to the lower surface of the first substrate 100. The second protruding portion 123c may be in the shape of a hemisphere, a polygonal pyramid (e.g., a triangular pyramid or a quadrangular pyramid), or a circular cone.

Hereinafter, a display device according to an embodiment will be described in more detail with reference to FIGS. 7 to 9.

Figure 7:
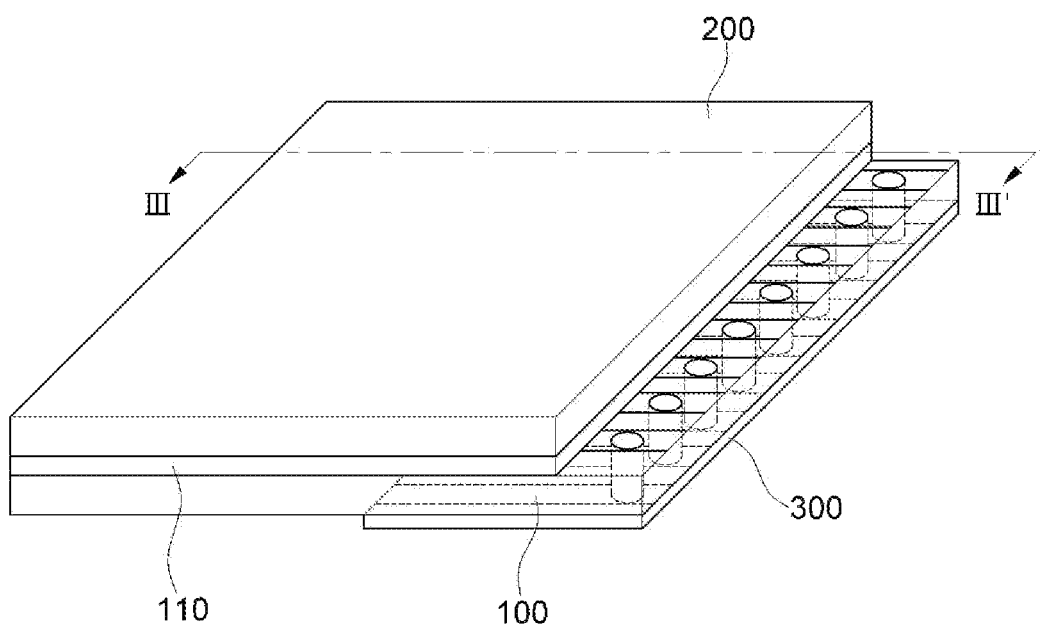
FIG. 7 is a perspective view illustrating a display device according to an embodiment.
Figure 8:
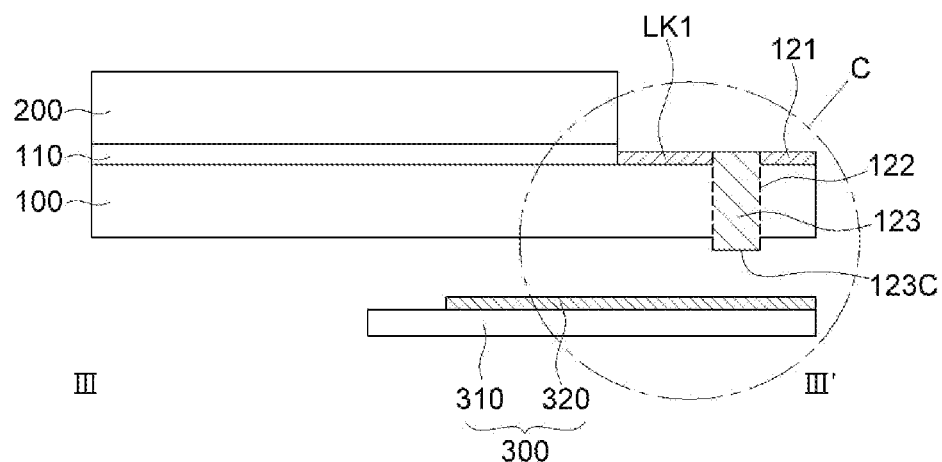
FIG. 8 is a cross-sectional view taken along line III-III' in FIG. 7.
Figure 9:
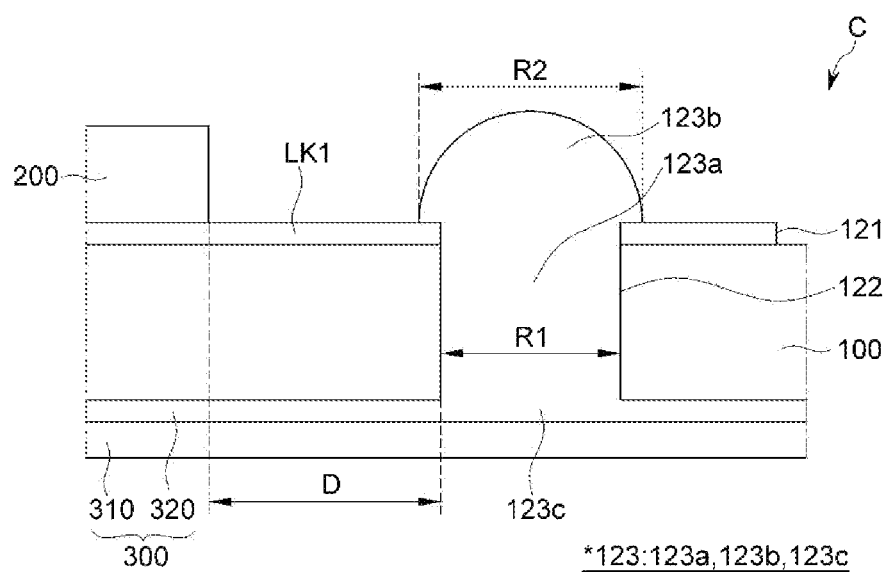
FIG. 9 is a view enlarging area C in FIG. 8.

FIG. 7 is a perspective view illustrating a display device according to an embodiment, FIG. 8 is a cross-sectional view taken along line III-III' in FIG. 7, and FIG. 9 is a view enlarging area C in FIG. 8.

Like description related to the display device according to the above, already described embodiments may not be provided again in the description of the display device of FIGS. 7 to 9. According to an embodiment and referring to FIGS. 7 to 9, a first lead line 320 of an FPCB 300 is electrically connected to a connection metal 123. For example, the first lead line 320 of the FPCB 300 directly contacts and is electrically connected to the connection metal 123.

According to an embodiment, the FPCB 300 may overlap a first link line LK1 that is connected to the connection metal 123. For example, the first lead line 320 may overlap the first link line LK1 that is connected to the connection metal 123.

Accordingly, the first lead line 320 may be disposed facing the first link line LK1 with the first substrate 100 therebetween.

Hereinafter, a method of manufacturing a display device according to an embodiment will be described in more detail with reference to FIGS. 10 to 14.

FIGS. 10 to 14 are views illustrating a method of manufacturing a display device according to an embodiment.

In one or more embodiments, the pixel connected to the gate line and the data line is formed at the display area DA of the first substrate 100, and the first link line LK1 and the pad terminal 121 are formed at the pad area PA. In such an embodiment, the second substrate may be disposed on the first substrate 100. However, embodiments are not limited thereto. In addition, the polarization film 200 is disposed so as to overlap the display layer 110 that is disposed at the display area DA of the first substrate 100, and the via hole 122 is defined at the pad terminal 121 to be defined through the first substrate 100.

Next, a process for forming the connection metal 123 that fills the via hole 122 is performed.

Figure 10:
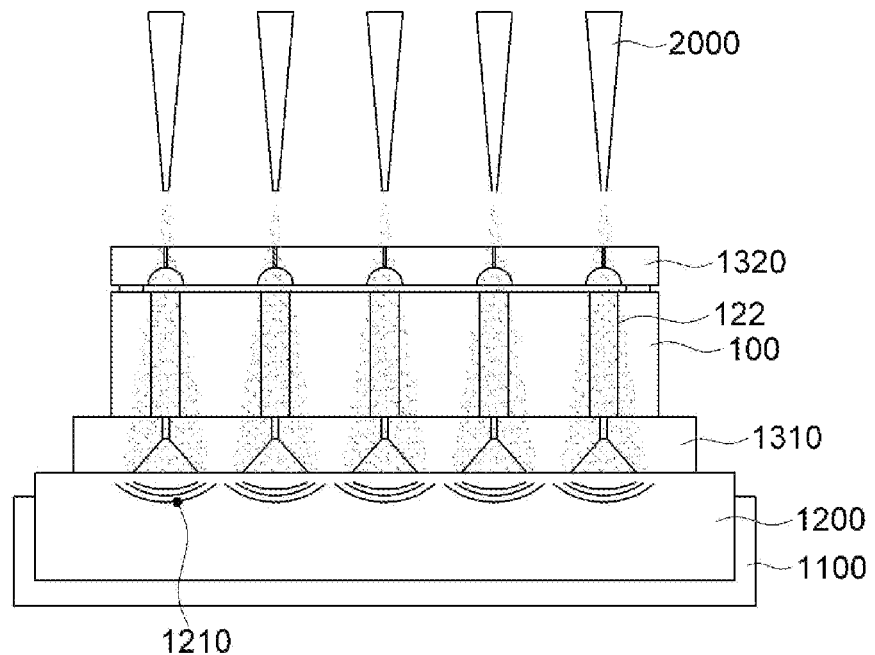
FIGS. 10 to 14 are views illustrating a method of manufacturing a display device according to an embodiment.

For example, referring to FIG. 10, a solid connection metal material 1200 and a nozzle glass 1310 are disposed on a pressurization unit 1100, and a display panel including the polarization film 200 is disposed on the nozzle glass 1310. For example, the first substrate 100 at which the via hole 122 is defined is disposed on the nozzle glass 1310. A cover glass 1320 is disposed on the display panel that includes the first substrate 100.

The pressurization unit 1100 may apply a pressure to the solid connection metal material 1200 that is disposed on the pressurization unit 1100.

The solid connection metal material 1200 may include metal. For example, the solid connection metal material 1200 may include at least one selected from low melting point metals (e.g., In, Sn, Zn, and/or Pb) and low melting point metal alloys (e.g., PbSn and/or InSn). Accordingly, a high temperature is not required in a laser process for filling the via hole, and thus it is possible to substantially minimize influence of heat that may be generated by the laser process onto the display panel that includes the first substrate 100 and the polarization film 200.

Each of the nozzle glass 1310 and the cover glass 1320 that are disposed at the lower surface and the upper surface of the first substrate 100, respectively, may include at least one selected from borosilicate glass, soda lime glass, quartz, and Pyrex. Accordingly, the nozzle glass 1310 and the cover glass 1320 are transparent, and thus a laser beam emitted from above the cover glass 1320 may be transmitted therethrough to melt the solid connection metal material 1200. In addition, because the nozzle glass 1310 and the cover glass 1320 have high heat resistance, it is possible to substantially minimize deformation of the nozzle glass 1310 and the cover glass 1320 due to the heat generated by the laser beam.

At the nozzle glass 1310, a nozzle that passes through upper and lower surfaces of the nozzle glass 1310 may be formed. For example, a nozzle 1311 that is located at the lower surface of the nozzle glass 1310 may have a width that gradually decreases. In addition, an orifice nozzle 1312 that is located at the upper surface of the nozzle glass 1310 may be connected to the nozzle 1311 that is located at the lower surface of the nozzle glass 1310, and may have a width that is substantially equal to a smallest width of the nozzle 1311 that is located at the lower surface of the nozzle glass 1310. Accordingly, a capillary phenomenon (or a desired capillary phenomenon) of a fluid that passes through the nozzles 1311 and 1312 of the nozzle glass 1310 may be promoted (or occur), which will be described in more detail with reference to FIG. 10.

The nozzle glass 1310, the display panel, and the cover glass 1320 are sequentially stacked on the solid connection metal material 1200, and then a laser beam 2000 is emitted to the solid connection metal material 1200 from above the cover glass 1320. Accordingly, a part of the solid connection metal material 1200 may be melted and become a liquefied connection metal material 1210. In such an embodiment, an ultrashort pulse laser may be used to substantially minimize an area where heat is generated due to the laser beam 2000.

Figure 11:
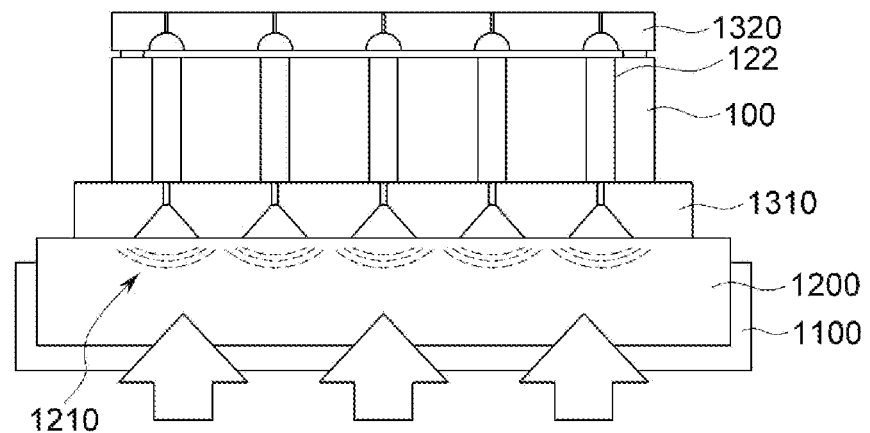
Figure 12:
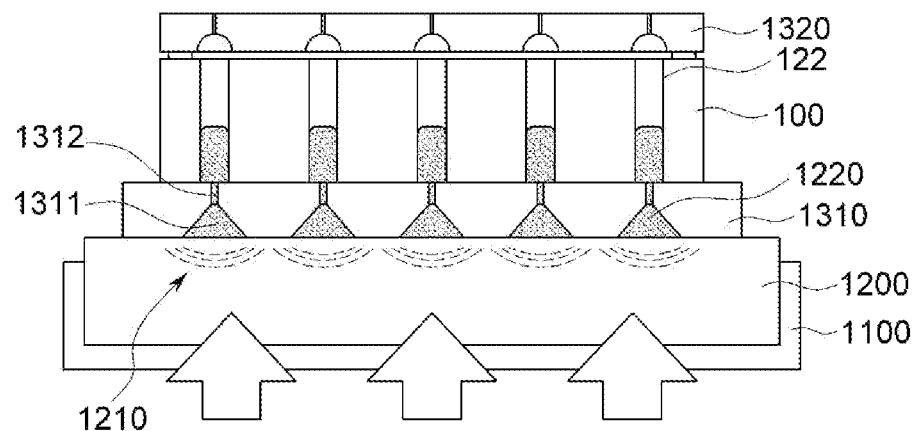

Next, referring to FIG. 11, a vacuum is generated at a space where the first substrate 100 defined with the via hole 122 is disposed, and the pressurization unit 1100 applies a pressure to the solid connection metal material 1200. Accordingly, as illustrated in FIG. 12, the liquefied connection metal material 1210 formed by partial melting is injected into the via hole 122 of the first substrate 100 along the nozzle of the nozzle glass 1310 by a pressure difference between the upper surface and the lower surface of the first substrate 100. For example, the liquefied connection metal material 1210 formed by partial melting is injected into the via hole 122 of the first substrate 100 along the nozzle of the nozzle glass 1310 by a pressure difference between the pressure applied by the pressurization unit 1100 from the lower surface of the first substrate 100 and the vacuum at the upper surface of the first substrate 100. In such a case, the nozzle of the nozzle glass 1310 may include the orifice nozzle that has a narrow width. Accordingly, a capillary phenomenon is promoted at the nozzle of the nozzle glass 1310, and thus the liquefied connection metal material 1210 formed by partial melting may be rapidly injected into the via hole 122.

Figure 13:
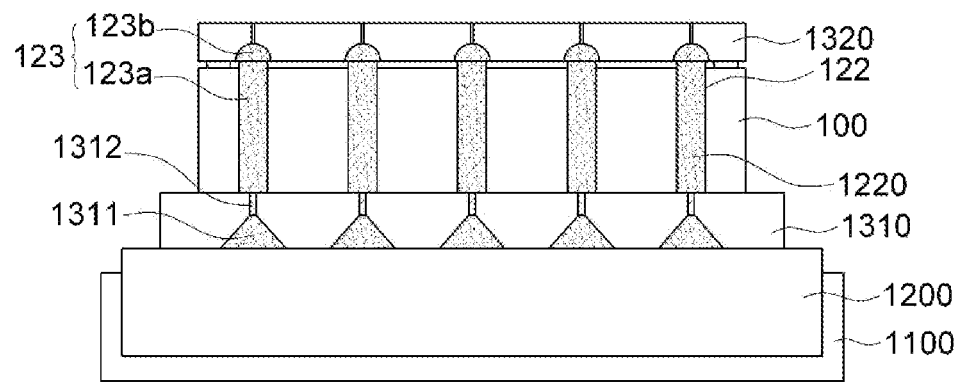

Accordingly, the via hole 122 is filled with the liquefied connection metal material 1210 that is formed by partial melting, and the connection portion 123*a* of the connection metal 123 may be formed. In addition, the liquefied connection metal material 1210 that is formed by partial melting is filled up to a lower surface of the cover glass 1320, and the first protruding portion 123*b* of the connection metal 123 may be formed. Accordingly, the solid connection metal material 1200 may be filled in accordance with a shape of the lower surface of the cover glass 1320. For example, the lower surface of the cover glass 1320 may have a concave portion in the shape of one selected from a hemisphere, a polygonal pyramid, a circular cone, a polygonal column, and a cylinder, and the liquefied connection metal material 1210 that is formed by partial melting may fill the concave portion of the lower surface of the cover glass 1320 that has the aforementioned shape (i.e., one selected from a hemisphere, a polygonal pyramid, a circular cone, a polygonal column, and a cylinder). As a more specific example, as illustrated in FIG. 13, the lower surface of the cover glass 1320 may have a concave portion that has a hemispherical shape, the liquefied connection metal material 1210 that is formed by partial melting may fill the concave portion of the lower surface of the cover glass 1320 that has a hemispherical shape, and, accordingly, the first protruding portion 123*b* that has a hemispherical shape may be formed.

Next, the vacuum at the upper surface of the first substrate 100 and the pressure applied to the lower surface of the first substrate 100 are released.

Figure 14:
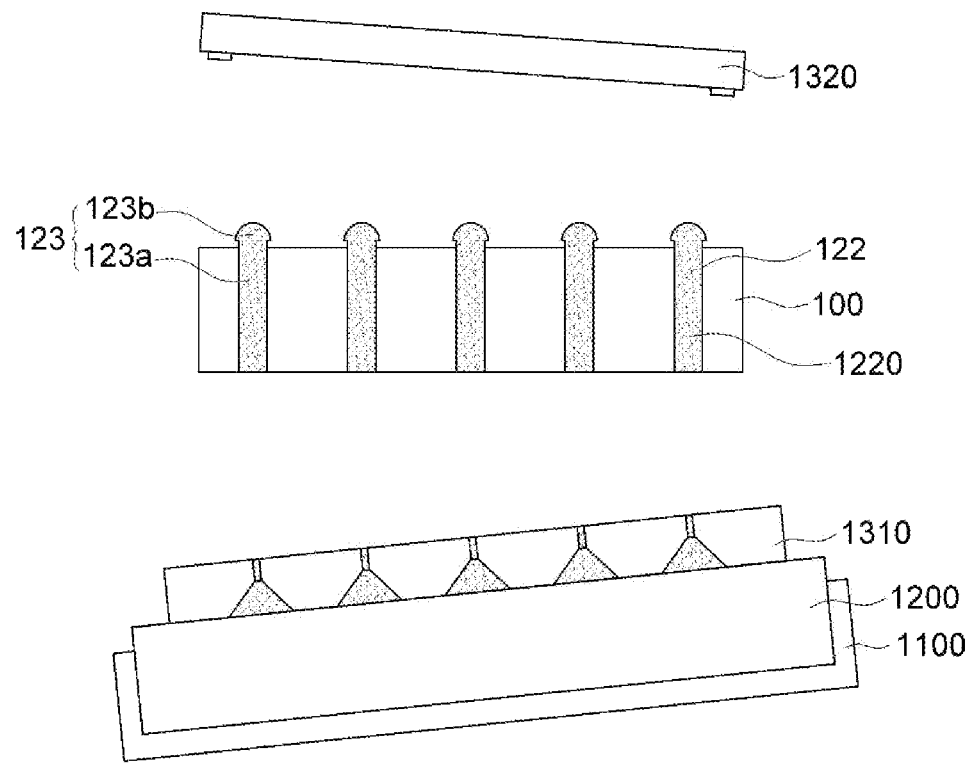

Referring to FIG. 14, the display panel is separated, and a display device is manufactured. For example, the display panel is separated from the pressurization unit 1100 and the solid connection metal material 1200 that are disposed at the lower surface of the first substrate 100, and from the cover glass 1320 that is disposed at the upper surface of the first substrate 100.

In one or more embodiments, the FPCB 300 may be disposed at a lower surface of the display panel that includes the first substrate 100, and the connection metal 123 and the first lead lines 320 of the FPCB 300 may be connected to each other.

According to an embodiment, the connection metal 123 disposed at the via hole 122 may connect the upper surface and the lower surface of the first substrate 100 to provide a conductive path. For example, the connection metal 123 is disposed at the via hole 122, and connects the pixels that are disposed at the upper surface of the first substrate 100 with the FPCB 300 that is disposed at the lower surface of the first substrate 100. For example, the connection metal 123 directly contacts and is electrically connected to the pad terminal 121 and the first link line LK1, extending from the data line, at the upper surface of the first substrate 100 and through the via hole 122. In addition, the connection metal 123 directly contacts and is electrically connected to the second link line LK2 at the lower surface of the first substrate 100 and through the via hole 122.

In addition, the second lead line of the FPCB 300 may be electrically connected to the driving integrated circuit 400, and the connection metal 123 may be connected to the driving integrated circuit 400 and receive signals from the driving integrated circuit 400.

As set forth hereinabove, according to one or more embodiments of the present invention, it is possible to substantially minimize damage to a display panel due to a laser process of filling a via hole.

The device and/or any other relevant devices or components according to embodiments of the present invention described herein may be implemented utilizing any suitable hardware, firmware (e.g., an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random-access memory (RAM). The computer program instructions may also be stored in other non-transitory computer-readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

While the present invention has been illustrated and described with reference to the embodiments thereof, it will be apparent to those of ordinary skill in the art that various changes in form and detail may be made thereto without departing from the spirit and scope of the present invention.

What is claimed is:

1. A display device comprising:
a first substrate having a display area and a pad area;
a polarization film being at an upper surface of the first substrate to overlap the display area;
a flexible printed circuit board being at a lower surface of the first substrate;
a via hole defined through the first substrate at the pad area; and
a connection metal located at the via hole,
wherein the connection metal comprises a connection portion in the via hole and a first protruding portion protruding from the first substrate, and
the polarization film is spaced apart from the via hole in a plan view.

2. The display device of claim 1, wherein the first protruding portion of the connection metal is in the shape of one selected from a hemisphere, a polygonal pyramid, a circular cone, a polygonal column, and a cylinder.

3. The display device of claim 1, further comprising:
a first link line at the pad area; and
a pad terminal connected to the first link line and having a width greater than a width of the first link line,
wherein a diameter or breadth of the connection portion of the connection metal is less than the width of the pad terminal.

4. The display device of claim 1, wherein the first substrate comprises at least one selected from borosilicate glass, soda lime glass, quartz, and Pyrex.

5. The display device of claim 1, wherein the connection metal comprises at least one selected from low melting point metals and low melting point metal alloys.

6. The display device of claim 5, wherein the low melting point metals are In, Sn, Zn, and/or Pb, and the low melting point metal alloys are PbSn and/or InSn.

7. The display device of claim 3, further comprising a second link line facing the first link line with the first substrate therebetween,
wherein the flexible printed circuit board comprises:
a base layer, and
a first lead line on the base layer, and
wherein the second link line directly contacts the connection metal.

* * * * *